United States Patent [19]

De Roo

[11] Patent Number: 4,520,278
[45] Date of Patent: May 28, 1985

[54] ELECTRONIC SWITCH
[75] Inventor: Minno De Roo, Delft, Netherlands
[73] Assignee: Deltakabel B.V., Gouda, Netherlands
[21] Appl. No.: 413,347
[22] PCT Filed: Dec. 21, 1981
[86] PCT No.: PCT/NL81/00027
  § 371 Date: Aug. 18, 1982
  § 102(e) Date: Aug. 18, 1982
[87] PCT Pub. No.: WO82/02301
  PCT Pub. Date: Jul. 8, 1982
[51] Int. Cl.³ .............. H03K 17/74; H03K 17/60; H03K 19/21
[52] U.S. Cl. .................... 307/253; 307/571; 307/317 R
[58] Field of Search .............. 307/253, 254, 317 R, 307/475, 571, 490

[56] References Cited

U.S. PATENT DOCUMENTS 4,000,428 12/1976 Harshbarger .............. 307/254
4,119,869 10/1978 Hashimoto .............. 307/317 R Primary Examiner—Stanley D. Miller
Assistant Examiner—B. P. Davis
Attorney, Agent, or Firm—Handal & Morofsky

[57] ABSTRACT

Electronic switch for switching electrical signals, comprising an input buffer (1) of the open collector type of which the input is connected to the control input (2) of the switch. The output of said input buffer is connected to (1) the input of an output buffer (3) which the output is connected to the signal output (8) of the switch, (2) a diode (4) of which the other electrode is connected to the signal input of the switch and (3) a load resistance (5). Furthermore the other terminal of said load resistance is connected to the signal input of the switch.

4 Claims, 2 Drawing Figures

PRIOR ART
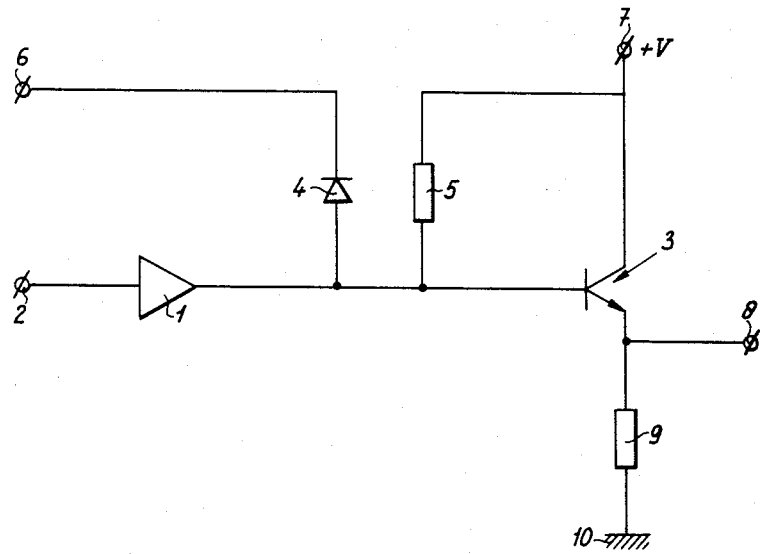
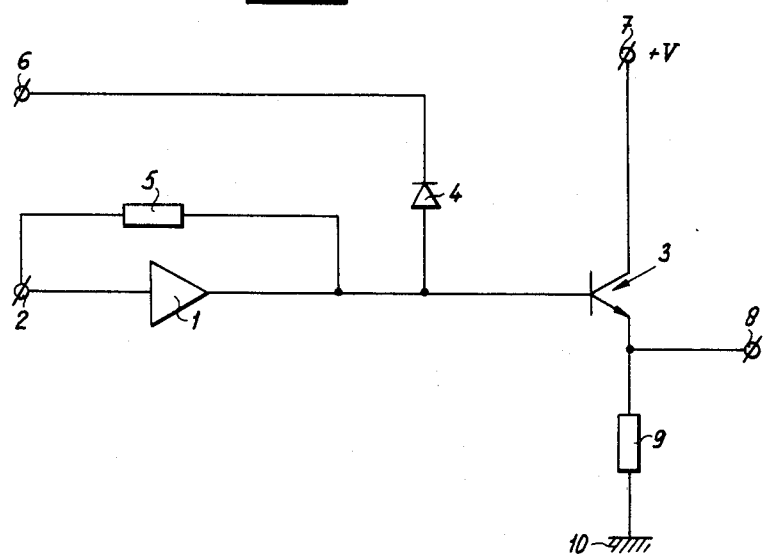

ELECTRONIC SWITCH

The invention relates to an electronic switch for switching electrical signals, comprising an input buffer of the open collector type of which the input is connected to the control input of the switch and of which the output is connected to (1) the input of an output buffer of which the output is connected to the signal input of the switch, (2) a diode of which the other electrode is connected to the signal input of said switch and (3) a load resistance.

Such a switch is already known from the Ducth Patent Application No. 75.11022. In said known switch one terminal of load resistance, of which the other terminal is connected to the output of the input buffer, is connected to one power supply terminal. The switch is controlled by a signal onto the control input having a potential equal to the potential of said one power supply terminal, or equal to the potential at the other power supply terminal.

FIG. 1 shows a schematic diagram of such a known switch. Said switch comprises the input buffer 1, of which the input is connected to the control input 2 of the switch. The output of said buffer 1 is connected to the base of the output transistor 3, to the one electrode of the diode 4 and to a terminal of the resistance 5. The other electrode of said diode 4 is connected to the signal input 6 and the other terminal of the resistance 5 is connected to the power supply terminal 7. The collector of the transistor 3 is also connected to said power supply terminal 7 and the emitter of said transistor is connected to the signal output of the switch and through the resistor 9 also connected to the other power supply terminal 10, which in this case is earthed. Said switch is controlled by a signal onto the control input 2 which signal may be switched between two levels equal to the one or the other power supply voltage level. The signals onto the signal input 6 are varying between said power supply levels. When the control input 2 is earthed, then also the output of the buffer 1 will be earthed, so that the diode is not conducting and it is not possible to transfer signals from the input 6 to the output 8. Also transistor 1 is not conducting. Because the output level of buffer 1 is approximately equal to the earth level a current is running through the resistance 5 and the output stage of the buffer 1. If a voltage practically equal to the power supply voltage +V is supplied to the control input 2, then the output of the buffer 1 will, because of the resistance 5, reach a level higher than the earth potential, so that diode 4 is conducting. Also transistor 3 comes into the conducting state because of said higher potential level and in this situation it is possible to transfer signals from the input 6 to the output 8. In this case a current is running through the transistor 3 and the load resistance 9 and through the resistance 5 and the diode 4. In a practical embodiment of this circuit it is not inconceivable that the "open" switch draws more current than the "closed" switch. Especially when such a switch is used into an array having a number of switches of equal type, whereby every time only one of said switches is closed, the fact that the open switches are drawing a relatively heavy current is a serious disadvantage.

The object of the invention is now to significantly reduce the current through the open switch.

According to the invention said object is reached in that the other terminal of the load resistance is connected to the signal input of the switch.

The result thereof is that, let alone eventual leakage currents, there is no current through the open switch.

The invention will be explained in detail with reference to an embodiment by way of example illustrated in the figures.

FIG. 1, which is already discussed, shows a prior art switch.

FIG. 2 illustrates a switch according to the invention.

The components used in the switch illustrated in FIG. 2 are indicated by the same reference numbers as the components in FIG. 1. It appears from a comparison between FIGS. 1 and 2 that only the resistance 5 is connected into the circuit in another way. In the circuit according to FIG. 2 said resistance is positioned between the input and the output of the input buffer 1. When the control input 2 is at the earth level, then also the output of the buffer will be at the earth level and the transistor 3 is not conducting. In this situation no current is flowing through the transistor 3 and also no current is running through the resistance 5. Let alone eventual leakage currents which are over very much lower order, no current is flowing through the switch in this case. However, when the control input 2 receives a voltage level which is approximately equal to the power supply voltage level, then the output level of the buffer 1 will increase and the transistor 3 and also the diode 4 are conducting. In this situation it is possible to transfer signals from the input 6 to the output 8. That implies that there is only flowing a current through said switch when said switch is "closed". If such a switch is used into an array having a large number of similar switches, of which at all moments only one switch is closed, then such an array will in comparison with an array in which switches of the type illustrated in FIG. 1 are used, draw an significantly lower current.

Switches of this type are for instance used for switching high frequency signals into an exchange of a cable television system. Each subscriber receives through an array of switches one of a number of available program signals. If thereby one program signal is chosen out of n available signals then n−1 "switches" will draw no current which, in contrast to the prior art situation, means a considerable current reduction for the total array.

The invention is not restricted to the embodiment illustrated in FIG. 2. Instead of the diode 4 it is for instance possible to use a transistor or FET, connected as diode. Furthermore in the above part description above a buffer of the so called open collector type is mentioned, but it will be clear that the invention also covers embodiments having buffers which are comprising FET endstages of similar type.

I claim:
1. An electronic switch controlled by a control signal for switching electrical signals comprising:
   (a) an input buffer circuit comprising an input port, an output transistor, and an output port, said input port being excited by said control signal; said output transistor having an internal load resistance substantially equal to that of an open circuit;
   (b) a load resistance having first and second electrodes, said first electrode being connected to said input port of said input buffer circuit, and said second electrode being connected to said output port of said input buffer circuit;

(c) diode means comprising first and second electrodes; the first electrode of said diode means functioning as an input terminal for said electronic switch, the second electrode of said diode means being connected to said second electrode of said load resistance and said output port of said buffer circuit, and (d) an output buffer circuit comprising first, second and third ports, said first port being commonly connected to said output port of said input buffer, to said second electrode of said load resistance, and to the second electrode of said diode means, second port of said output buffer functioning as an output terminal for said electronic switch, said third port being connected to a voltage potential, said electronic switch being in a substantially open circuit condition when said control signal is at a potential level where the output port of said input buffer circuit has a potential, which reverse bias said diode means, said electronic switch being in a substantially closed circuit condition when said control signal is at a potential level where the output port of said input buffer circuit has a potential which forward biases said diode means.

2. An electronic switch according to claim 1, wherein said output buffer circuit comprises a transistor device having base, collector and emitter electrode, and a resistor, said base electrode being commonly connected to said output port of said input buffer, to said second electrode of said load resistance, and to the second electrode of said diode means, said collector electrode being excited by a first bias potential, said resistor having first and second electrodes, said emitter electrode being connected to said first electrode of said resistor, and said second electrode of said resistor being excited by a second bias potential.

3. An electronic switch according to claim 1, wherein said diode means is a transistor.

4. An electronic switch according to claim 2, wherein said transistor is a field effect transistor.

* * * * *